Figure 1:
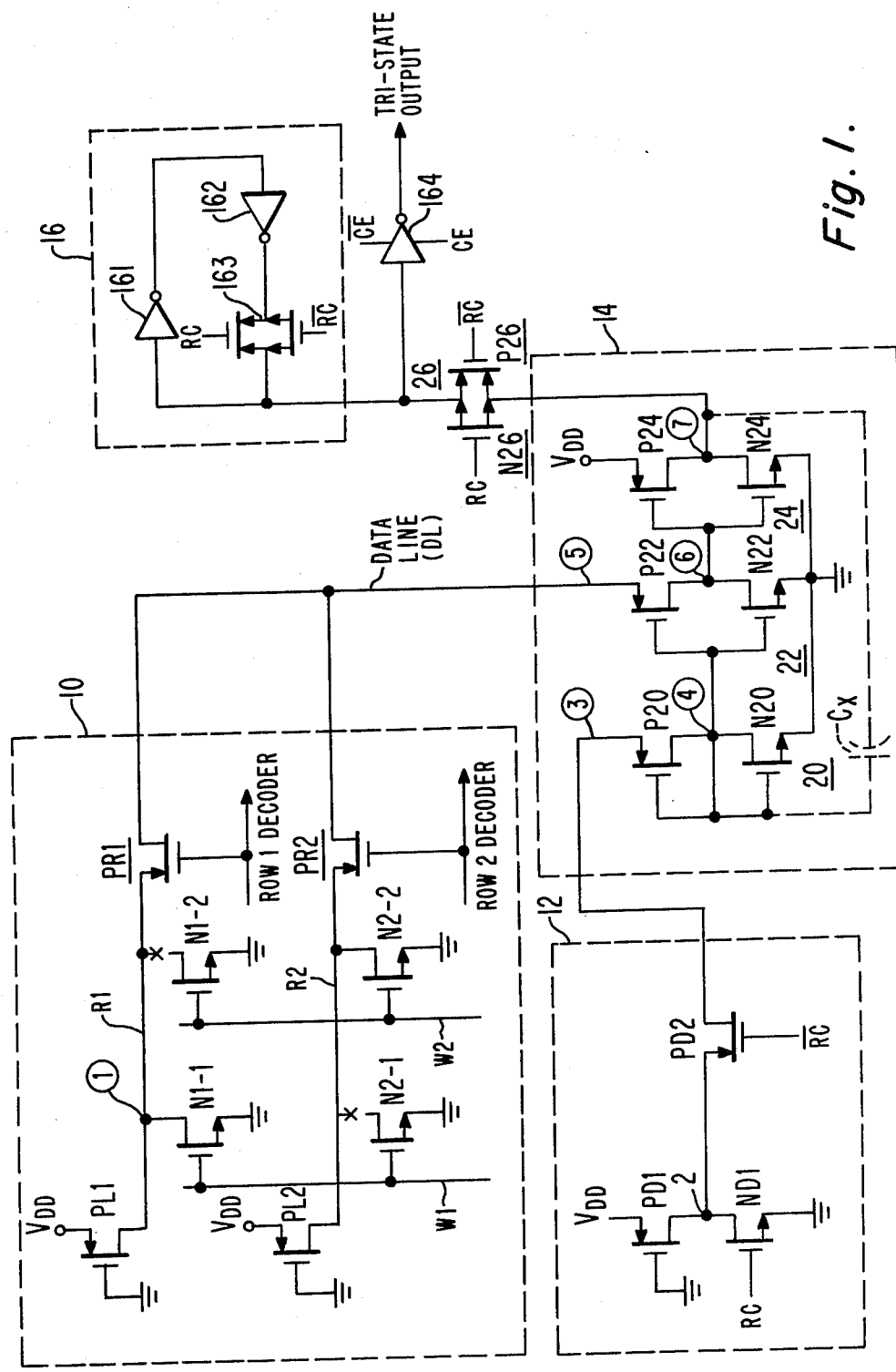

United States Patent [19]

Jindra et al.

[11] 4,270,190
[45] May 26, 1981

[54] SMALL SIGNAL MEMORY SYSTEM WITH REFERENCE SIGNAL

[75] Inventors: Clifford P. Jindra, North Plainfield; James H. Atherton, Flemington, both of N.J.

[73] Assignee: RCA Corporation, New York, N.Y.

[21] Appl. No.: 106,882

[22] Filed: Dec. 27, 1979

[51] Int. Cl.³ .......................... G11C 7/00; G11C 7/06
[52] U.S. Cl. ................................ 365/208; 365/205; 365/210
[58] Field of Search ............... 365/205, 208, 210, 104, 365/154; 307/DIG. 1, DIG. 3

[56] References Cited

U.S. PATENT DOCUMENTS

| | | | |
|---|---|---|---|
| 3,600,609 | 8/1971 | Christensen | 365/205 |
| 4,031,524 | 6/1977 | Heeren | 365/205 |
| 4,136,292 | 1/1979 | Suzuki et al. | 365/208 |

Primary Examiner—Stuart N. Hecker
Attorney, Agent, or Firm—Samuel Cohen; Henry I. Schanzer

[57] ABSTRACT

A memory array of cells produces output signals having either one of a high value (i.e. $V_H$) or a low value (i.e. $V_L$). The difference between $V_H$ and $V_L$ is significantly less than the operating voltage (e.g. $V_{DD}$) applied across the memory cells and $V_H$ and $V_L$ are offset towards one of the voltage rails (e.g. $V_{DD}$ or ground ). The memory cell output signals are compared to a reference signal ($V_R$) derived either from a "dummy" cell or from a memory cell being sensed, where $V_R$ has a value which is less positive than $V_H$ but more positive than $V_L$. The reference signal and a memory cell signal, are applied to a sense amplifier which is responsive to a relatively small difference between the two signals and which can produce an output ($V_O$) which is approximately symmetrical with respect to the mid point ($V_{DD}/2$) of the operating voltage. A signal ($V_H$) more positive than $V_R$ causes $V_O$ to be more positive than $V_{DD}/2$ and a signal ($V_L$) less than $V_R$ causes $V_O$ to be less positive than $V_{DD}/2$. Thereby, high speed sensing, amplification and centering of the small, offset, memory signals are achieved simultaneously.

8 Claims, 3 Drawing Figures

SMALL SIGNAL MEMORY SYSTEM WITH REFERENCE SIGNAL

This invention relates to a high-speed, high-density memory system in which the necessity to precharge the bit lines is eliminated and in which the voltage difference between the logic "1" ($V_H$) and logic "0" ($V_L$) levels produced by the memory cells is significantly less than the operating voltage applied to the memory cells.

A significant problem in the design of a high density, high speed Read-Only-Memory (ROM) or Random-Access-Memory (RAM) is the need, prior to each read cycle, to place the memory in a known condition to obtain a meaningful read-out and/or to reduce the possibility of disturbing the information stored in the memory. Known memory arrays include means for precharging certain nodes and (bit data) lines to a known voltage before starting to read data out of the memory. A precharge pulse must be applied for a period of time which is sufficiently long to ensure that the memory array is charged to the desired level under the worst case condition. The precharge cycle thus takes time which adds directly to the memory access time. This slows down the speed with which data can be read-out of the memory in response to an address change (i.e. a request for information).

Another problem is the time it takes to sense the logic "1" ($V_H$) and logic "0" ($V_L$) levels. The difference $\Delta V$ between these $V_H$ and $V_L$ levels preferably is smaller than the difference between the operating voltage levels which, for example, may be $V_{DD}=5$ volts and ground —0 volts in order to reduce the read-out period. The time it takes to discharge a node from 6 volts to zero volts is obviously much longer than the time it takes to discharge that node through a smaller voltage increment say, for example, 5 volts to 4.5 volts. This is of particular significance where the device, or devices, discharging the node are high impedances, as is preferably the case in high density memory arrays. Hence, it is desirable for the difference between the logic "1" and the logic "0" levels to be relatively small. But, this gives rise to the problem of accurately, reliably, and quickly sensing the small difference.

The problems discussed above are resolved in systems embodying the invention in which the value of the operating voltage ($V_P$) for one stage of the sense amplifier is derived from the memory cell output signal. The one stage of the sense amplifier includes an inverting stage of the type which has a "flip-point" voltage ($V_{FP}$) which is equal to (approximately) $V_P/K$; where K is a constant greater than 1. $V_{FP}$ will have one value corresponding to $V_H$ and another value corresponding to $V_L$.

The system also includes circuitry for generating a reference signal where the reference signal has a value which is less positive than $V_H$ but more positive than $V_L$. The reference signal after being divided by K is applied to the input of the inverting stage and functions as its $V_{IN}$. For $V_{IN}$ more positive than $V_{FP}$ of the stage, the output voltage ($V_O$) of the stage assumes a "low" value below $V_P/K$ and for $V_{IN}$ less positive than the $V_{FP}$ of the stage, $V_O$ assumes a "high" value above $V_P/K$.

The inverting stage thus functions to compare the $V_H$ and $V_L$ memory cell signals, whose difference is small and which are significantly offset with respect to the center range of the operating potential, to the reference signal and to produce an output which is symmetrical with respect to the quiescent operating point ($V_{IN}$) of the stage.

Figure 2:
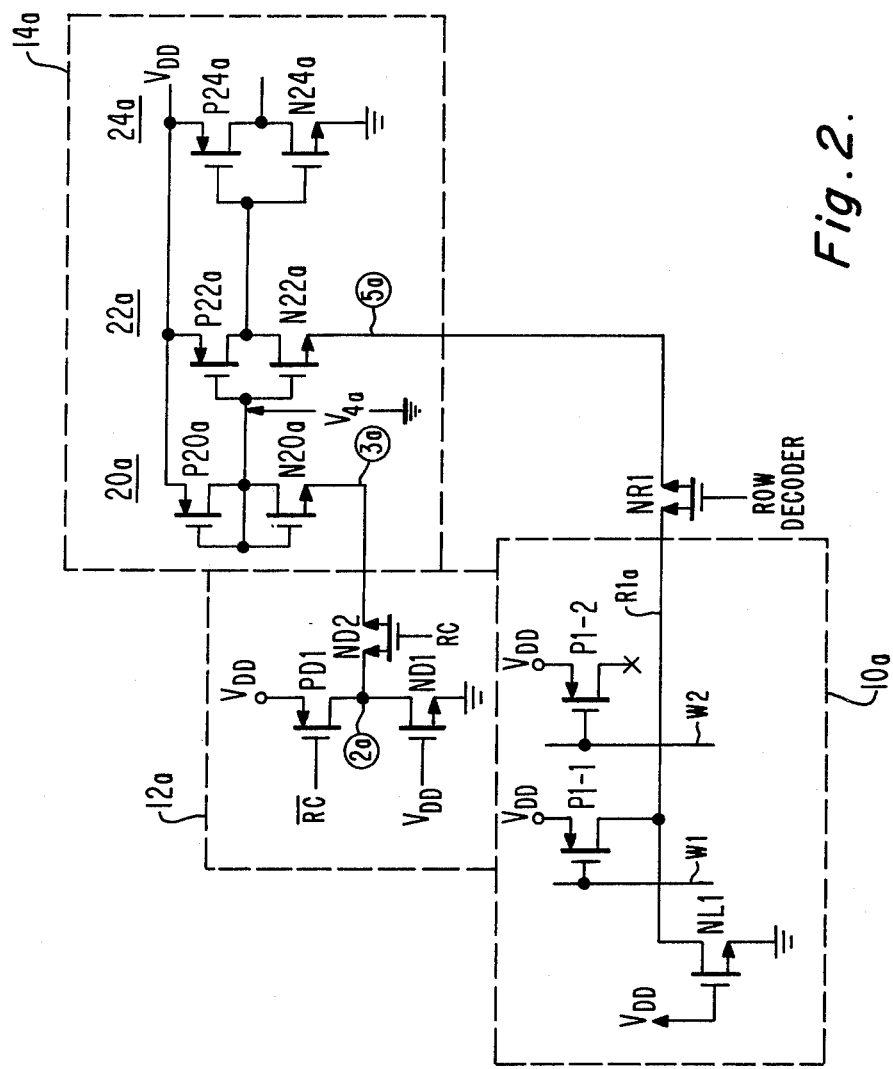
Figure 3:
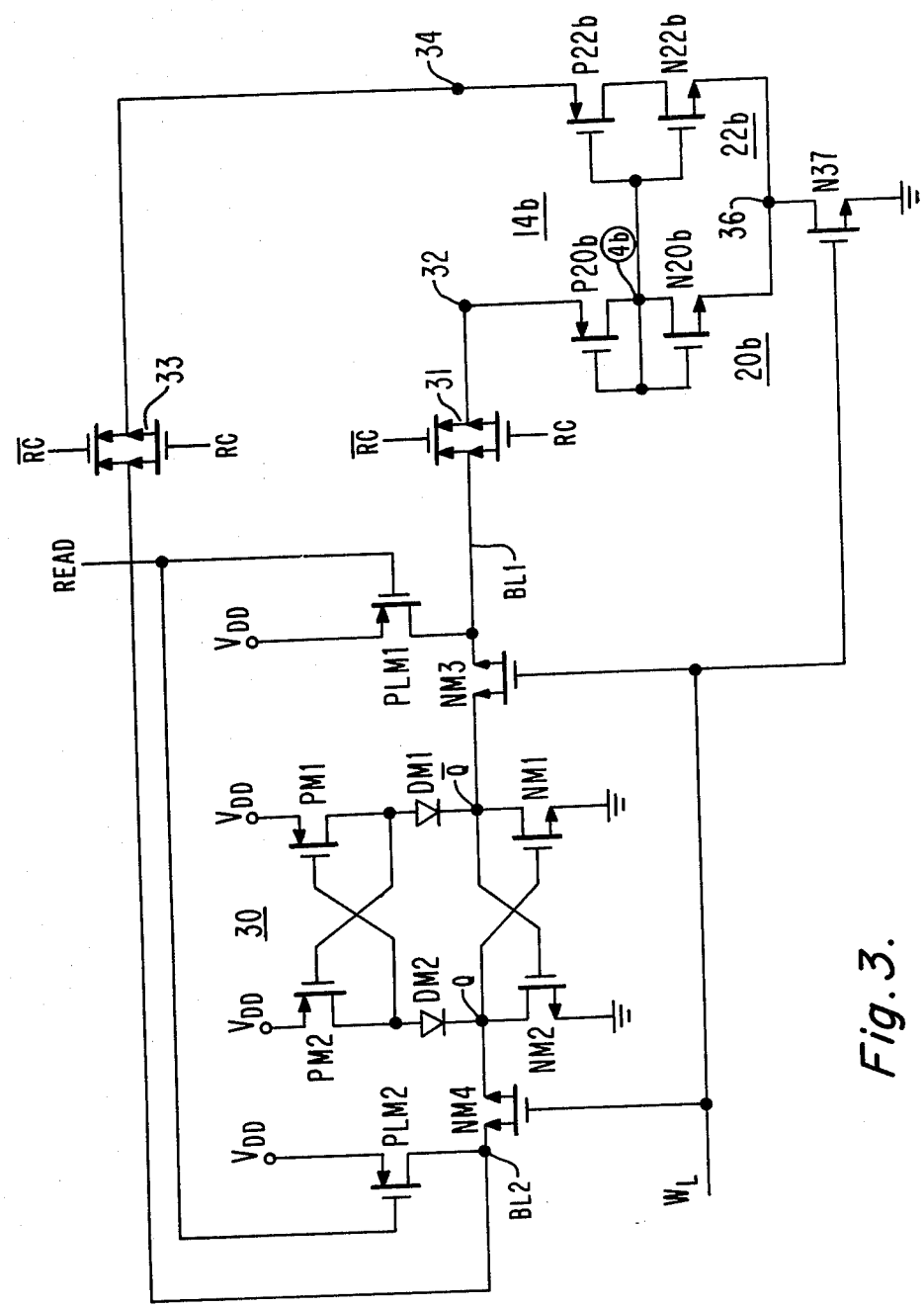

In the accompanying drawing like reference characters denote like components; and FIGS. 1 and 2 are schematic diagrams of Read-Only Memory (ROM) systems embodying the invention; and FIG. 3 is a schematic diagram of a Random-Access-Memory (RAM) cell and sense circuit combination embodying the invention.

The circuit of FIG. 1 includes a Read Only Memory (ROM) array 10, a "dummy" (reference) cell 12, a sense amplifier 14 for comparing an output from array 10 with a reference signal generated by cell 12, and a data latch 16 for statically storing the output of sense amplifier 14.

The ROM array 10 (only two rows and two columns of which are shown) is comprised of row conductors (R1..., R2) and column (Word) conductors (W1, W2) disposed in an orthogonal direction to the row conductors. Each intersection of a row conductor and a column conductor defines a bit location. There is a single data storage (memory) IGFET, Ni-j, of N conductivity type at each bit location. The gate electrode of each IGFET in a column is connected to the column conductor for that column and the source electrodes of all the N-IGFETs are connected to ground. Each IGFET at a bit location either has: (a) its drain connected to its associated row conductor (e.g. N1-1, N2-2) in which event that bit location is arbitrarily defined as storing a logic "0"; or (b) its drains is disconnected from its associated row conductor (e.g. N1-2, N2-1) in which event that bit location is arbitrarily defined as storing a logic "1".

The conduction path of a P type load IGFET (PL1, PL2) is connected between each row conductor and $V_{DD}$ which is typically 5 volts. The gate electrodes of the load IGFETs are connected to ground potential so that the load IGFETs are always conducting and the row conductors are normally at, or very close to, $V_{DD}$. The load IGFETs are designed to pull the row conductors towards the $V_{DD}$ level; those of the memory transistors (Ni-j) connected to the row conductors when on, attempt to pull the row conductors toward zero volts (logic "0"). Maintaining the rows normally "high" eliminates the need to precharge the row conductors (bit lines) and data lines of the memory since, prior to each read command, the row conductors are already in the desired "high" condition.

The contents of the cell of ROM 10 are read by applying a potential of $V_{DD}$ volts to a selected word line Wj. This turns on all the memory cells IGFETs whose gates are connected to that word line. The memory cell IGFET (e.g. N2-1) whose drain is not connected to a row conductor does not conduct a current and its corresponding row conductor (e.g. R2) remains at $V_{DD}$ (logic "1" due to its turned-on load IGFET (e.g. PL2). The memory cell IGFET (e.g. N1-1) whose drain is connected to a row conductor conducts saturaion current (I) and the potential (e.g. V1) of that row (e.g. R1) drops to $[V_{DD}-IZ_{PL}]$, corresponding to logic "0"; where $Z_{PL}$ is the impedance of the load device (e.g. PL1) connected to that row.

The swing between the logic "1" level ($V_H$) and the logic "0" level ($V_L$) is intentionally made small by making the impedances ($Z_{Nij}$) of the conduction paths of the N-type IGFETs, all of which are approximately equal to each other, much larger than the impedances ($Z_{PL}$) of the load IGFETs (PLi), all of which are approximately equal to each other. To make the memory as dense as possible, the memory cell transistors (Ni-j) are made as small as possible. It is important to conserve area because the ROM may have, for example, 64,000 (or more) memory cell transistors and it is desired that they all fit on the same chip. The impedance (Z) of an IGFET is a function of its physical size, which can be relatively well controlled. Z=f (L/W) where L is the channel length and W is the channel width. Hence, the ratio of the sizes (and impedances) of the IGFETs (P and N) to each other is well defined.

The "dummy" or reference cell 12, which includes IGFETs PD1 and ND1, functions to generate a reference voltage ($V_R$) intermediate the $V_H$ and $V_L$ voltage levels of the ROM cells. The conduction path of PD1 is connected between $V_{DD}$ and a node 2 and the conduction pah of ND1 is connected between node 2 and ground. The gate electrode of PD1 is returned to ground potential while a read-control pulse (RC) is applied to the gate electrode of ND1. PD1 which is of the same conductivity type as the load devices PLi, is designed to have an impedance $Z_{PD1}$ equal to one-half the impedance of $Z_{PL}$. IN practice, PD1 may be formed by connecting, in parallel, the conduction paths of two transistors similar to the PLi transistors. PD1 is then effectively twice the size of the PLi transistors and its $Z_{PD1}$ is equal to $Z_{PL}/2$. IGFET ND1 is of the same conductivity type and size as the memory cell N-type IGFETs of the ROM. Making ND1 the same size as the memory cell transistors ensures tracking over temperature, voltage, and fabrication processing. Also, it would be difficult to make ND1 smaller than the Ni-j transistors since, as a practical matter, the latter are already made about as small as can be managed with an acceptable yield. A read-control (RC) pulse having an amplitude of $V_{DD}$ volts is applied to the gate electrode of ND1 during a read cycle. This is the same amplitude turn on signal ($W_i = V_{DD}$) that is applied to the gate electrodes of the memory cell transistors. Hence, ND1, when turned on, conducts a saturation current (I) which is approximately equal to the current (I) conducted by a turned on memory cell transistor. Therefore, the voltage drop across PD1 is approximately one-half ($\frac{1}{2}$) that across PLi (since $Z_{PD1} = \frac{1}{2} Z_{PL}$) when a current I flows through PLi.

In general, the signal voltage (e.g. V1) produced on any of the row conductors will be equal to one of (a) $V_{DD}$ volts, or (b) $[V_{DD} - \Delta V]$ volts; where $\Delta V$ is equal to $(I) \cdot (Z_{PL})$, and where I is the saturation current-through a memory cell N-type IGFET or ND1. The reference voltage (V2) at node 2 is equal to $[V_{DD} - \Delta V/2]$ volts, since $I_{ND1} = I_{Nij}$ and $Z_{PD1} = Z_{PDi}/2$.

The information generated on a row conductor (R1, R2) is selectively coupled via its associated transmission gate transistor (PR1, PR2) to a data line (DL) which is connected to node 5 which is a signal input of sense circuit 14. The reference cell output (V2) is coupled via a transmission gate transistor PD2 to a node 3 which defines another input terminal of circuit 14.

Thus, to read data out of memory 10, a word line (Wi) is energized ($V_{DD}$ is applied to it) and a gating transistor (PRi) is turned on coupling a selected row conductor to the bit line and hence to node 5. Concurrently, RC goes positive turning on ND1 and establishing a reference signal, and $\overline{RC}$ goes negative turning on PD2 which couples the reference signal to node 3.

The sense amplifier 14 includes a bias generating stage 20 comprised of transistors P20 and N20, a signal sensing stage 22 comprised of transistors P22 and N22, and a buffer stage 24 comprised of transistors P24 and N24.

The conduction paths of transistors P20 and N20 are connected in series between node 3 and ground. The gates and drains of P20 and N20 are connected in common to node 4 to which is also connected the gate electrodes of transistors P22 and N22. The conduction paths of P22 and N22 are connected in series between node 5 and ground and the drains of P22 and N22, defining the output node, 6, of stage 22, are connected to the gate electrodes of P24 and N24. The sources of P24 and N24 are connected to $V_{DD}$ and ground, respectively, and their drains are connected in common to the sense amplifier output node 7. In the discussion it should be noted that the shape of the transfer curve and hence the flip point of a complementary inverter is dependent on the impedances of the N and P transistors forming the inverters; where Z=f(L/W). The switching point, transistion point, or flip point of an inverter may then be controlled by proper selection and design of the width to length (W/L) ratios of the IGFETs forming the inverters; [This assumes that the other IGFET parameters (e.g. the threshold voltages, oxide thickness, doping levels), are the same.] Also the flip point defines the point at which the input voltage ($V_{IN}$) of a complementary inverter is equal to the output voltage ($V_O$) of the inverter.

P20 and N20 are designed to have approximately equal impedances over their operating range. By connecting the gates and drains of P20 and N20 in common, P20 and N20 function as a self-biased inverter whose quiescent point (V4 at node 4) is set near the mid point of the operating potential applied across the inverter. The operating potential across inverter 20 is the difference between the potential (V3) applied to the source of P20 and the potential (0 volts) applied to the source of N20. Hence, V4 is equal to V3/2 and for V3 equal to $[V_{DD} - \Delta V/2]$ volts, V4 is equal to $[V_{DD}/2 - \Delta V/4]$ volts. V4, directly applied to the gates of P22 and N22 functions as the bias voltage V3/2 to stage 22 placing it in its high gain region. P22 and N22 are also designed to have approximately equal impedances (i.e. $Z_{PN22} = Z_{N22}$ when $V_{IN} = V_{OUT}$) over the operating range. P22 and N22 then form a complementary inverter whose "flip-point" voltage ($V_{FP}$) is equal to $\frac{1}{2}$ the operating potential ($V_P = V_5$) applied across the inverter stage 22.

$V_P$ across stage 22 is the difference between the potential (V5) applied to the source of P22 and the potential (0 volts) applied to the source of N22. $V_{FP}$ of inverter 22 for the condition of $Z_{P22} = Z_{N22}$ when $V_{IN} = V_{OUT}$, is equal to V5/2.

In the circuit of FIG. 1 the impedance of PD2 is made equal to the impedance of PR1 plus one-half the impedance of PL1. This ensures that the impedance looking back from node 3 into the reference circuit towards A.C. ground is equal to the impedance looking back from node 5 into the memory signal circuit towards A.C. ground. Consequently, although there are voltage drops across PR1 and PD2 the reference voltage ($V_R$) applied to node 3 will have a level midway between the $V_H$ and $V_L$ levels applied to node 5 and will track that voltage for substantially all foreseeable conditions.

Although, not exactly correct, it is assumed for ease of the discussion below that V2 is coupled to node 3 without any loss of amplitude and that the voltage on any row conductor is coupled to node 5 without any loss of amplitude. Therefore, V5 is either equal to $V_{DD}$ volts or to $[V_{DD}-\Delta V]$ volts; V3 is equal to $[V_{DD}-\Delta V/2]$ and V4 is equal to $[V_{DD}/2-\Delta V/4]$ volts. For $V5=V_H=V_{DD}$, the $V_{FP}$ of stage 22 is equal to $V_{DD}/2$. Since V4 is equal to $[V_{DD}/2-\Delta V/4]$ volts, V4 is less positive than the $V_{FP}$ of inverter 22, [i.e. $V4-V_{FP}=(V_{DD}/2-\Delta V/4)-V_{DD}/2=(-)\Delta V/4]$. Consequently, P22 conducts more than N22 and the output V6 of inverter 22 is considerably more positive than $V_{DD}/2$.

For $V5=V_L=[V_{DD}-\Delta V]$ volts, the $V_{FP}$ of inverter 22 is equal to $[V_{DD}/2-\Delta V/2]$ volts. Since V4 is equal to $[V_{DD}/2-\Delta V/4]$ volts, V4 is more positive than the $V_{FP}$ of inverter 22. Consequently, P22 conducts less than N22 and the output V6 of inverter 22 is considerably less positive than $V_{DD}/2-\Delta V/2$. The actual value of V6 is determined by the product of the voltage gain (Av) of the inverter which may range, for example, between 10 and 40 and the difference between V4 and $V_{FP}$.

For example, for Av=20 and for the difference between V4 and $V_{FP}$ being either plus or minus 100 millivolts, V6 will be either at $[V_{DD}/2+2]$ volts when V5 is "high" or at $[V_{DD}/2-0.2-2]$ volts when V5 is low.

By way of example, a circuit embodying the invention was built in which: (a) the current (I) drawn by the Ni-j transistors and ND1 was 400 microamperes ($400\times10^{-6}$ amperes); (b) the impedance ($Z_{PL}$) of the PLi transistors was approximately 1 K ohms; (c) the impedance of PD1 was 500 ohms; and (d) the operating voltage $V_{DD}$ was equal to 5 volts.

Consequently, (with the transmission gates PRi and PD2 open), $\Delta V$ was 0.4 volts, with $V_H$ being equal to $V_{DD}$, $V_L$ being equal to 4.6 volts and $V_R$ equal to 4.8 volts.

The memory cell signals ($V_H$ or $V_L$) which are significantly offset with respect to the midpoint of the operating voltage ($V_{DD}$) are applied to an input (node 5) of stage 22 and generate either a high $V_{FP}$ or a low $V_{FP}$ which is compared to a reference input (V4) to produce an output (V6) which is symmetrical with respect to V4. It has, thus, been shown that the outputs ($V_H$ and $V_L$) of a memory cell which are close to one of the voltage rails (e.g. $V_{DD}$) can be accurately and quickly detected.

V6 is then applied to the input of buffer stage 24 operated as a conventional complementary inverter. Stage 24 is designed to amplify V6 to ensure that the output V7 of the sense amplifier is either clamped to $V_{DD}$ (when V6 is low) or is clamped to ground (when V6 is high).

A speed up capacitor $C_X$ may be connected between nodes 7 and 4 of sense circuit 14. With $C_X$ connected in the circuit, a change in voltage at node 7 is fed back via $C_X$ to the input of stage 22. Inverter 22 amplifies and inverts the signal which is applied to the input of inverter 24 which again amplifies and inverts the signal. Thus, with $C_X$ in the circuit, any change at nodes 4, 6 or 7 is positively fed back with substantial gain, quickly driving the sense circuit to the ultimate state to which it is being driven.

In order to reduce the power dissipation of the system, when information is not being read RC is low turning off ND1 and $\overline{RC}$ is high decoupling the dummy cell from the sense circuit.

To statically store the information sensed by sense amplifier 14, the output V7 is coupled via a transmission gate 26 (turned on during Read) to latch circuit 16 which includes inverters 161 and 162 and a transmission gate 163. Following the transfer of data bit from sense amplifier 14 to the latch 16, the transmission gate 163 is turned on cross-coupling inverters 161 and 162 which then statically store the data bit.

The output of the latch is also applied to the tristate output stage 164 which is selectively enabled by means of chip enable signals CE and $\overline{CE}$ for coupling the data read out to other utilization circuits (not shown).

In the discussion above, it was assumed that the $V_{FP}$ of inverters 20 and 22 was one-half their $V_P$. However, the $V_{FP}$ of an inverter can be designed to have a value other than one half the operating voltage. Hence, in general, $V_{FP}$ may be expressed as $V_P/K$ where $V_P$ is the operating potential across the inverter and K is a constant greater than 1.

The circuit of FIG. 2 is a memory system in which the structure and operation is complementary to that of FIG. 1. A ROM 10a includes memory cell IGFETs (Pi-j) of P-conductivity type and load IGFETs (NLi) of N conductivity type. The conduction path of IGFETs Pi-j, when turned on, are of much higher impedance than that of NLi, when turned on. Thus, the potential on row conductor R1a during read out is either at, or close to, zero volts for one binary condition or it is at some small potential, $\Delta V$, (e.g. 0.4 volts) above ground for the other binary condition.

A "dummy" cell 12a includes devices PD1 and ND1 which produce a reference voltage at node 2a which is approximately equal to $\Delta V/2$ (e.g. 0.2 volts).

The reference cell output is coupled via a transistor ND2 to node 3a of a sense circuit 14a and the memory cell output is coupled via a transistor NR1 to node 5a of sense circuit 14a. Transistors ND2 and NR1 are turned on by positive signals applied to their gate electrodes during a read cycle.

The inputs to sense amplifier 14a are applied to the source electrodes of the N type transistors instead of to the sources of the P-type transistors as in FIG. 1. This enables, the input signals to be amplified and level shifted "up" and to produce output signals which vary symmetrically about V4a at the output of stage 22a.

Except for the differences discussed and those due to the complementary nature of the circuit, the operation of the circuit of FIG. 2 is analogous to that of FIG. 1 and need not be further detailed.

FIG. 3 illustrates that the outputs of a 6 transistor RAM cell may be made to swing between two levels ($V_H$ and $V_L$) which are very close to one of the voltage rails and may be quickly and accurately sensed. The RAM cell 30 has two outputs Q and $\overline{Q}$. When storing one binary condition, arbitrarily defined as the logic "1" condition, Q is high and $\overline{Q}$ is low. Transistor PM2 is on and transistor PM1 is off. Transistor NM2 is off and transistor NM1 is on. Diode DM2 conducts and Q is at or close to $V_{DD}$ while $\overline{Q}$ is clamped to ground. When storing the other binary condition, Q is low and $\overline{Q}$ is high. PM2 is off and PM1 is on. NM2 is on and NM1 is off. Diode DM1 conducts and $\overline{Q}$ is at, or close to $V_{DD}$ while Q is at, or close to, zero volts.

The outputs (Q and $\overline{Q}$) of the cell are selectively coupled to bit lines BL1 and BL2 by means of "pass" transistors NM3 and NM4.

When the contents of cell 30 are to be read out NM3 and NM4 are turned on by the application of $V_{DD}$ volts to their gate electrodes. Transistor NM3 then couples $\overline{Q}$ to BL1 and transistor NM4 couples Q to BL2.

Lines BL1 and BL2 are coupled to $V_{DD}$ via the conduction paths of transistors PLM1 and PLM2, respectively. The impedance of the source-to-drain paths of PLM1 and PLM2 (when on) is much lower than the ON impedance of NM4 in series with NM2 and NM3 in series with NM1. Transistors PLM1 and PLM2 are always turned on during a read cycle by the application of a signal of 0 volts to their gate electrodes. This eliminates the need to precharge the RAM since the bit lines will always normally be "high". The bit lines are normally held "high" since the RAM cell 30, as designed, can pull a bit line down towards zero volts but cannot easily or quickly pull a bit line up to $V_{DD}$. Cell 30 represents one cell of an array of cells, each of which is designed to be written (set) when a "low" or "zero" input is applied to one of its two inputs (BL1 or BL2) and a "high" to the other input. However, the cell is impervious (un-upsettable) to the application of a "high" to both of its inputs. Thus, driving both bit lines "high" by turning on PLM1 and PLM2 does not disturb the cell. Rather, with the bit lines high, the memory array is always placed in a condition where it is ready to be read without the need for precharging. As soon as a cell is selected (NM3 and NM4 are turned on) the one output (Q or $\overline{Q}$) which is at "0" quickly pulls its bit lines down to $V_L$ where $V_L$ is assumed equal to $V_{DD}-\Delta V_X$ while the other output which is at "1" and its bit line, which is at $V_{DD}$, remains at $V_{DD}$. $\Delta V_X$ is equal to the relatively low impedance (Z) of PLM1 or PLM2 multiplied by the current flowing through NM1 or NM2. $\Delta V_X$ is a relatively small signal and may be assumed equal to 0.2 volts when $V_{DD}$ is, for example, equal to 5.0 volts. Thus, when Q is high BL2 is at, or close to, $V_{DD}$ while BL1 is at $[V_{DD}-0.2]$ volts. When $\overline{Q}$ is high BL1 is at $V_{DD}$ and BL2 is at $[V_{DD}-0.2]$ volts.

Transmission gates 31 and 33 are turned-on during a read cycle and couple BL1 and BL2 to nodes 32 and 34, respectively, which define the input terminls of a sense amplifier 14b.

Sense amplifier 14b includes a bias generating stage 20b and a signal comparing stage 22b which are similar in structure and operating to stages 20 and 22, respectively, in FIG. 1. Stages 20b and 22b are returned to ground potential by means of a switching transistor N37 having its conducting path connected between node 36 and ground. N37 is turned on during each read cycle and clamps node 36 to ground via a relatively low impedance.

The operation of the sense amplifier is briefly as follows:

When Q is high, BL2 and node 34 are at $V_{DD}$. Concurrently, $\overline{Q}$ is low, and BL1 and node 32 are at $[V_{DD}-\Delta V_X]$ volts. With node 34 at $V_{DD}$, the $V_{FP}$ of stage 22b is at $V_{DD}/2$. Concurrently, with node 32 at $[V_{DD}-\Delta V_X]$ volts, the voltage ($V_{4b}$) at node 4b is at $[V_{DD}/2-\Delta V_X/2]$ volts. Since $V_{4b}$ is less than the $V_{FP}$ of 22b, P22b is turned on harder than N22b causing the output of stage 22b to be significantly more positive than $V_{DD}/2$.

When Q is low, BL2 and node 34 are at $[V_{DD}-\Delta V_X]$ volts; $\overline{Q}$ is high causing BL1 and node 32 to be at $V_{DD}$. With node 34 at $[V_{DD}-\Delta V_X]$ volts, the $V_{FP}$ of stage 22b is equal to $[V_{DD}/2-\Delta V_X/2]$ volts. Concurrently, with node 32 at $V_{DD}$, $V_{4b}$ is at $V_{DD}/2$. Since $V_{4b}$ is more positive than the $V_{FP}$ of 22b, N22b is turned on harder than P22b causing the output of stage 22b to be significantly less positive than $V_{DD}/2$.

Comparing the Q output and its complement ($\overline{Q}$) enables a very small difference (e.g. 0.2 volts) between the $V_H$ and $V_L$ level to be reliably and very quickly sensed. Also, in FIG. 3 one of the outputs (e.g. Q) functions as the reference generating signal against which the other output ($\overline{Q}$), which functions as the signal generating signal, is compared.

What is claimed is:

1. The combination comprising:
    a memory array of cells, each cell producing at its output a signal having either one of a high value ($V_H$) or a low value ($V_L$);
    a reference signal producing means having an output at which is produced a signal which is less positive than $V_H$ and which is more positive than $V_L$;
    an inverting stage having first and second terminals, an input terminal, and an output terminal; said inverting stage having a "flip-point" voltage ($V_{FP}$) equal to $V_P/K$, where $V_P$ is the potential applied between said first and second terminals; and K is a constant greater than 1; and where $V_{FP}$ is the voltage for which the input voltage ($V_{IN}$) applied to said input terminal is equal to the output voltage ($V_O$) at said output terminal;
    means for selectively coupling a cell output signal across said first and second terminals of said inverting stage, whereby the $V_{FP}$ of said inverting stage has either a high value or a low value, corresponding to $V_H$ and $V_L$, respectively; and
    means for dividing by K the signal at the output of said reference signal producing means and for applying the divided reference signal to said input terminal of said inverting stage.

2. The combination as claimed in claim 1 wherein said memory array of cells includes row and column conductors, the intersection of each row and column conductors defining a bit location; wherein each bit location storing one binary value includes a memory transistor having its control electrode connected to a column conductor and one end of its conduction path connected to a row conductor;
    wherein each bit location storing the other binary value includes a memory transistor whose conduction path is not connected to a row conductor;
    wherein the other ends of the conduction paths of said memory transistors are connected to a first point of operating potential; and
    wherein the conduction path of a load transistor is connected between each row conductor and a second point of operating potential, and wherein the impedance of the conduction path of the load transistor is significantly less than the impedance of the conduction path of said memory transistor.

3. The combination as claimed in claim 2 wherein said reference signal producing means includes first and second reference generating transistors having their conduction paths connected in series between said first and second points of operating potential for producing at the junction of their conduction paths a potential which is intermediate $V_H$ and $V_L$.

4. The combination as claimed in claim 3 wherein said inverting stage includes first and second inverting transistors of first and second conductivity type, respectively, each transistor having a control electrode and a conduction path,
    wherein the conduction path of said first inverting transistor is connected between said first terminal and said output terminal; wherein the conduction path of said second inverting transistor is connected between said output and said second terminal, wherein the control electrodes of said first and second inverting transistors are connected to said input terminal, wherein said means for selectively coupling a cell output across said first and second terminals of said inverting stage includes a first transmission gate means for selectively connecting one of said row conductors to said first terminal of said first inverting stage; and wherein the second terminal of said inverting stage is connected to one of said first and second points of operating potential.

5. The combination as claimed in claim 4 wherein said means for dividing by K the signal at the output of said reference signal producing means and for applying the divided reference signal to said input terminal of said inverting stage includes:

a reference signal coupling transistor having its conduction path connected between the junction of the conduction paths said first and second reference generating transistors and a reference node;

first and second bias transistors of first and second conductivity type, respectively, each bias transistor having a conduction path and a control electrode;

means connecting the conduction path of said first bias transistor between said reference node and the input terminal of said inverting stage, means connecting the conduction path of said second bias transistor between said input terminal of said inverting stage and said one of said first and second points of operating potential; and means connecting the control electrodes of said first and second bias transistors to the input terminal of said inverting stage.

6. The combination as claimed in claim 5 wherein the impedance of said first transmission gate means plus the impedance of the load transistor connected to a row conductor is approximately equal to the impedance of said reference signal coupling transistor plus the impedance of said first reference generating transistor.

7. The combination as claimed in claim 1 where each one of said cells is a static cell; wherein associated with each cell is a first output point and a second output point at which is produced the complement of the signal at said first output; and wherein the equivalent impedance between each output point of a cell and a first point of operating potential is significantly greater than the equivalent impedance between each output point and a second point of operating poteitnal, whereby the difference between the $V_H$ and $V_L$ levels is relatively small in comparison to the operating potential applied between said first and second points of operating potential.

8. The combination as claimed in claim 7 wherein said means for selectively coupling a cell output signal across said first and second terminals of said inverting stage includes a first selectively enabled transmission gate means connected between said first output point and said first terminal of said inverting stage, and wherein said second terminal of said inverting stage is connected to one of said first and second points of operating potential;

wherein said reference signal producing means includes a second selectively enabled transmission gate means connected between said second output point and a reference node, wherein said means for dividing by K includes:

first and second bias transistors, each bias transistors having first and second electrodes defining the ends of a conduction path and a control electrode, means connecting the conduction path of said first bias transistor between said reference node and said input terminal of said inverting stage, means connecting the conduction path of said second bias transistor between said input terminal of said inverting stage and said first point of operating potential, and means connecting the control electrodes of said first and second bias transistor to said input terminal of said inverting stage.

* * * * *

UNITED STATES PATENT AND TRADEMARK OFFICE
CERTIFICATE OF CORRECTION

PATENT NO. : 4,270,190

DATED : May 26, 1981

INVENTOR(S) : Clifford Paul Jindra et al.

It is certified that error appears in the above-identified patent and that said Letters Patent is hereby corrected as shown below:

Col. 1, line 33 change "6" to --- 5 ---.

Col. 3, line 15 "pah" should be --- path ---.

line 21 change "IN" to --- In ---.

line 63 change "$\overline{RC}$" to --- RC ---.

line 64 change "RC" to --- $\overline{RC}$ ---.

Col. 6, line 41 change "symmetricallyabout" to --- symmetrically about ---.

Col. 7, line 3 insert after "and" --- of ---.

line 40 change "operating" to --- operation ---.

line 59 change "Q" to --- $\overline{Q}$ ---.

Signed and Sealed this

Thirteenth Day of October 1981

[SEAL]

Attest:

GERALD J. MOSSINGHOFF

Attesting Officer　　　Commissioner of Patents and Trademarks